(12) United States Patent
Hsu et al.

(10) Patent No.: US 11,592,856 B2
(45) Date of Patent: *Feb. 28, 2023

(54) SWITCHABLE POWER SUPPLY

(71) Applicant: Taiwan Semiconductor Manufacturing Co., Ltd., Hsinchu (TW)

(72) Inventors: Kuoyuan Hsu, San Jose, CA (US); Sungchieh Lin, Hsinchu (TW); Bing Wang, Palo Alto, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 87 days.

This patent is subject to a terminal disclaimer.

(21) Appl. No.: 17/168,689

(22) Filed: Feb. 5, 2021

(65) Prior Publication Data

US 2021/0157350 A1 May 27, 2021

Related U.S. Application Data

(63) Continuation of application No. 15/720,387, filed on Sep. 29, 2017, now Pat. No. 10,921,839.
(Continued)

(51) Int. Cl.
*G05F 3/02* (2006.01)
*H03K 19/173* (2006.01)
(Continued)

(52) U.S. Cl.
CPC ............... *G05F 3/02* (2013.01); *G05F 1/465* (2013.01); *G11C 5/147* (2013.01); *G11C 7/20* (2013.01);
(Continued)

(58) Field of Classification Search
CPC . G05F 1/46; G05F 1/462; G05F 1/465; G05F 3/02; G05F 3/08; G05F 3/16;
(Continued)

(56) References Cited

U.S. PATENT DOCUMENTS

| 4,528,458 A | 7/1985 | Nelson et al. |
| 5,602,506 A | 2/1997 | Kim et al. |

(Continued)

FOREIGN PATENT DOCUMENTS

| CN | 101728940 A | 6/2010 |
| CN | 102291103 A | 12/2011 |

(Continued)

*Primary Examiner* — Matthew V Nguyen
(74) *Attorney, Agent, or Firm* — Sterne, Kessler, Goldstein & Fox P.L.L.C.

(57) ABSTRACT

The present disclosure describes a power supply switch that includes a voltage generator, a switch circuit, and a confirmation circuit. The voltage generator is configured to compare a first power supply voltage to a second power supply voltage and to output the first power supply voltage or the second power supply voltage as a bulk voltage ($V_{bulk}$). The switch circuit includes one or more transistors and is configured to (i) bias bulk terminals of the one or more transistors with the $V_{bulk}$ and (ii) output either the first power supply voltage or the second power supply voltage as a voltage output signal. The confirmation circuit is configured to output a confirmation signal that indicates whether the voltage output signal transitioned from the first power supply voltage to the second power supply voltage.

20 Claims, 10 Drawing Sheets

Related U.S. Application Data

(60) Provisional application No. 62/552,008, filed on Aug. 30, 2017.

(51) Int. Cl.
*G05F 1/46* (2006.01)
*G11C 5/14* (2006.01)
*G11C 7/20* (2006.01)
*H02M 3/155* (2006.01)

(52) U.S. Cl.
CPC ......... *H03K 19/1733* (2013.01); *H02M 3/155* (2013.01)

(58) Field of Classification Search
CPC .... G05F 3/24; H03K 19/173; H03K 19/1733; G11C 5/14; G11C 5/143; G11C 5/148; G11C 5/17; G11C 7/20
See application file for complete search history.

(56) References Cited

U.S. PATENT DOCUMENTS

| | | | | |
|---|---|---|---|---|
| 7,663,426 | B2* | 2/2010 | Fong | H03K 19/00315 327/530 |
| 7,936,632 | B2* | 5/2011 | Kang | G11C 11/4074 327/530 |
| 8,125,846 | B2* | 2/2012 | Lee | G11C 5/145 365/189.09 |
| 2002/0008547 | A1 | 1/2002 | Shimano et al. | |
| 2007/0055908 | A1 | 3/2007 | Kubo et al. | |
| 2009/0016106 | A1 | 1/2009 | Tran et al. | |
| 2009/0278571 | A1 | 11/2009 | Pietri et al. | |
| 2012/0092072 | A1 | 4/2012 | Upputuri et al. | |
| 2015/0149825 | A1 | 5/2015 | Lucas et al. | |
| 2016/0294193 | A1* | 10/2016 | Yuk | G11C 5/147 |
| 2016/0308355 | A1 | 10/2016 | Price et al. | |
| 2017/0372652 | A1 | 12/2017 | Tamura et al. | |
| 2018/0091130 | A1 | 3/2018 | Tanabe | |
| 2019/0064866 | A1 | 2/2019 | Hsu et al. | |
| 2019/0348917 | A1* | 11/2019 | Lee | G05F 1/56 |
| 2021/0320630 | A1* | 10/2021 | Li | H03K 5/24 |

FOREIGN PATENT DOCUMENTS

| | | | | |
|---|---|---|---|---|
| CN | 102446537 A | 5/2012 | | |
| DE | 44 45 750 A1 | 10/1995 | | |
| DE | 102019118013 A1 * | 2/2020 | ............. | H02H 3/325 |
| KR | 10-2001-0057284 | 7/2001 | | |
| KR | 20030001858 A | 1/2003 | | |
| KR | 20140025936 | 3/2014 | | |
| KR | 20140082179 A | 7/2014 | | |
| KR | 20160059525 A | 5/2016 | | |
| TW | 201437780 A | 10/2014 | | |
| TW | 201715334 A | 5/2017 | | |

\* cited by examiner

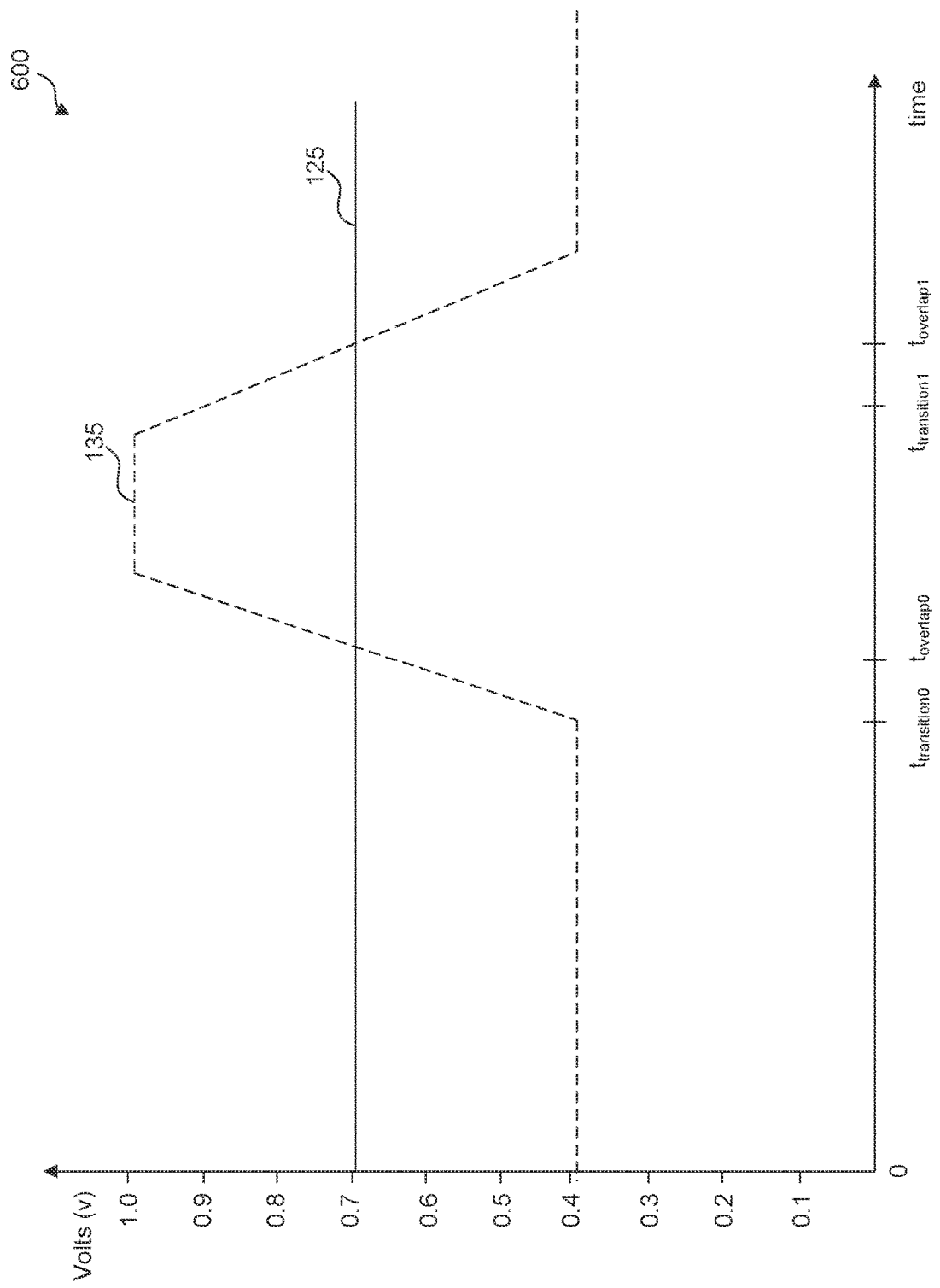

SWITCHABLE POWER SUPPLY

CROSS-REFERENCE TO RELATED APPLICATION

This application is a continuation of U.S. Non-provisional patent application Ser. No. 15/720,387, titled "Switchable Power Supply," filed on Sep. 29, 2017, which claims the benefit of U.S. Provisional Application No. 62/552,008, titled "Switchable Power Supply," filed on Aug. 30, 2017, both of which are incorporated by reference herein in their entireties.

BACKGROUND

A system on a chip (SOC) is an integrated circuit that combines components of a computer system or other electronic system on a single chip. The SOC can include digital, analog, and mixed-signal components on a single substrate. The different components may require different power supply voltages for proper operation. To operate in multiple power supply domains, the SOC may require different power supply voltages as inputs to the system.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIG. 6 is an illustration of an example timing waveform for power supply voltages provided to a memory array of a memory device in a system on chip, according to some embodiments.

DETAILED DESCRIPTION

Figure 1:
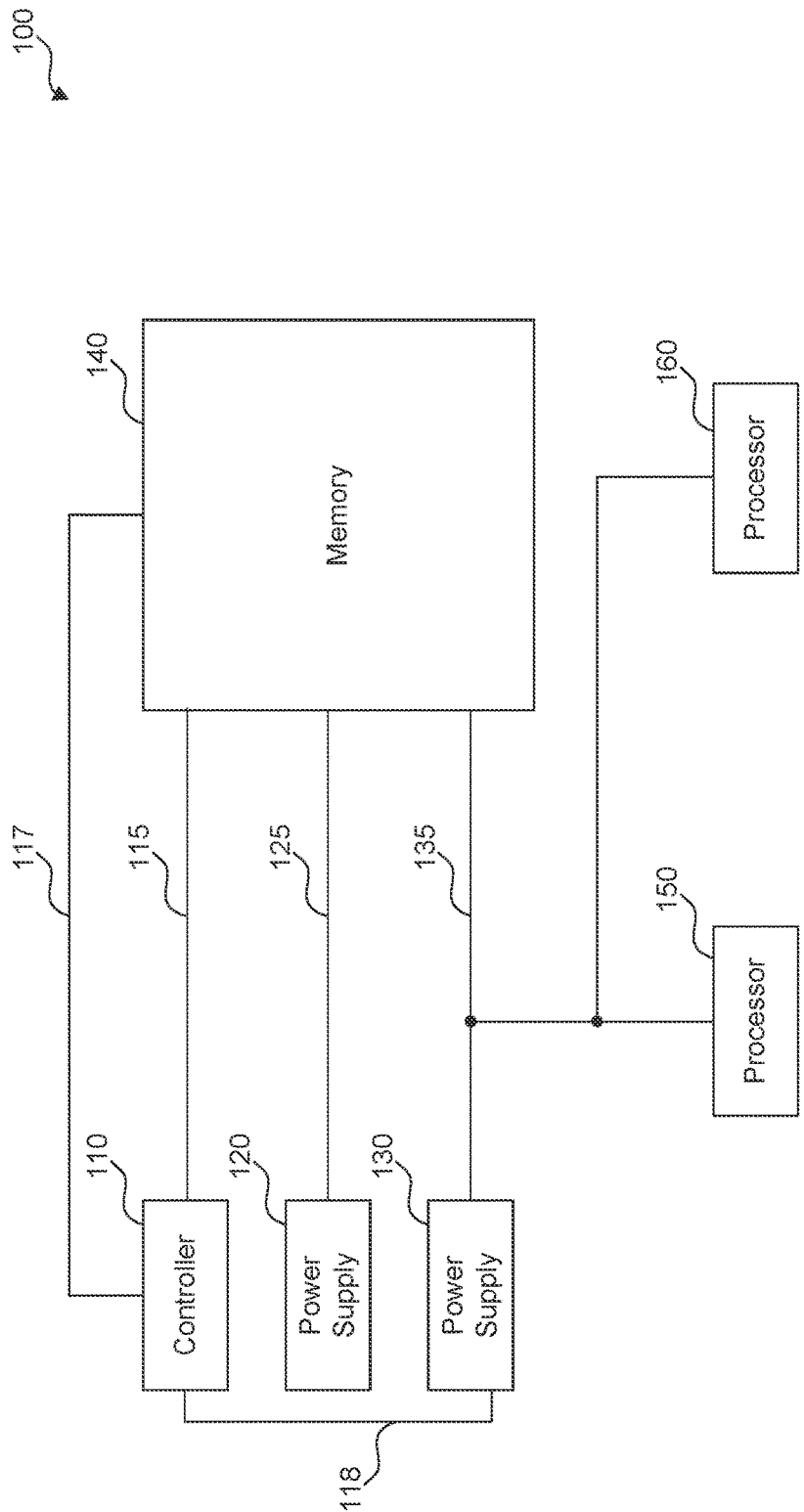
FIG. 1 is an illustration of a system on chip, according to some embodiments.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity, and clarity and, unless indicated otherwise, does not in itself dictate a relationship between the various embodiments and/or configurations discussed.

The present disclosure describes a power supply switch and power supply system configured to transition a power supply voltage provided to a memory array of a memory device between a first power supply voltage and a second power supply voltage. A benefit, among others, in transitioning the power supply voltage from the first power supply voltage to the second power supply voltage—e.g., from a lower power supply voltage to a higher power supply voltage—is that circuits in the memory array can operate faster, thus improving memory, performance. For example, the memory array can include circuits such as oscillators, amplifiers, and voltage generators. With a higher power supply voltage provided to these circuits, the memory array can operate faster, thus improving memory read and write performance.

FIG. 1 is an illustration of a system on chip (SOC) 100, according to some embodiments. SOC 100 includes a controller device 110, power supply generators 120 and 130, a memory device 140, a processor device 150, and a processor device 160. SOC 100 can include other components, which are within the spirit and scope of the present disclosure. For simplicity, these other components are not shown in FIG. 1.

In some embodiments, SOC 100 can have multiple power supplies. The multiple power supplies are provided by power supply generators 120 and 130. Power supply generator 120 provides a power supply voltage 125 to memory device 140. Power supply generator 130 provides a power supply voltage 135 to memory device 140, processor device 150, and processor device 160. In some embodiments, power supply voltages 125 and 135 can each be 0.4V, 0.6V, 0.7V, 1.0V, 1.2V, 1.8V, 2.4V, 3.3V, or 5V. Other values for power supply voltages 125 and 135 are possible; these other power supply voltage values are within the spirit and scope of the present disclosure.

In some embodiments, memory device 140 can operate in multiple power domains, requiring power supply voltages 125 and 135. Controller device 110 provides a control signal 115 to memory device 140 so that a memory array of memory device 140 can operate using either power supply voltage 125 or power supply voltage 135. The multiple power domains of memory device 140—as well as a confirmation signal 117 to indicate a transition from power supply voltage 125 to power supply voltage 135 in memory device 140—is described in further detail below with respect to FIGS. 2-7.

Controller device 110 also provides a control signal 118 to power supply generator 130, according to some embodiments. As described below, in some embodiments, power supply generator 130 can transition power supply voltage 135 between a first power supply voltage (e.g., 0.4V) and a second power supply voltage (1.0V). Control signal 118 can control power supply generator 130 to transition power supply voltage 135 between the first and second power supply voltages, according to some embodiments.

In referring to FIG. 1, memory device 140 can be a static random access memory (SRAM) device, according to some embodiments. Memory device 140 can be other types of memory devices such as, for example, a dynamic random access memory (DRAM) device, a synchronous DRAM (SDRAM), a flash memory device, a magneto-resistive RAM (MRAM), a phase-change RAM, or a ferroelectric RAM. These other types of memory devices are within the spirit and scope of the present disclosure.

In some embodiments, processor devices 150 and 160 can be a central processing unit (CPU), a graphics processing unit (GPU), or a combination thereof. Processor devices 150 and 160 can be other types of processing devices such as, for example, a network processing device, a sound processing device, or an application-specific integrated circuit. These other types of processing devices are within the spirit and scope of the present disclosure.

Figure 2:
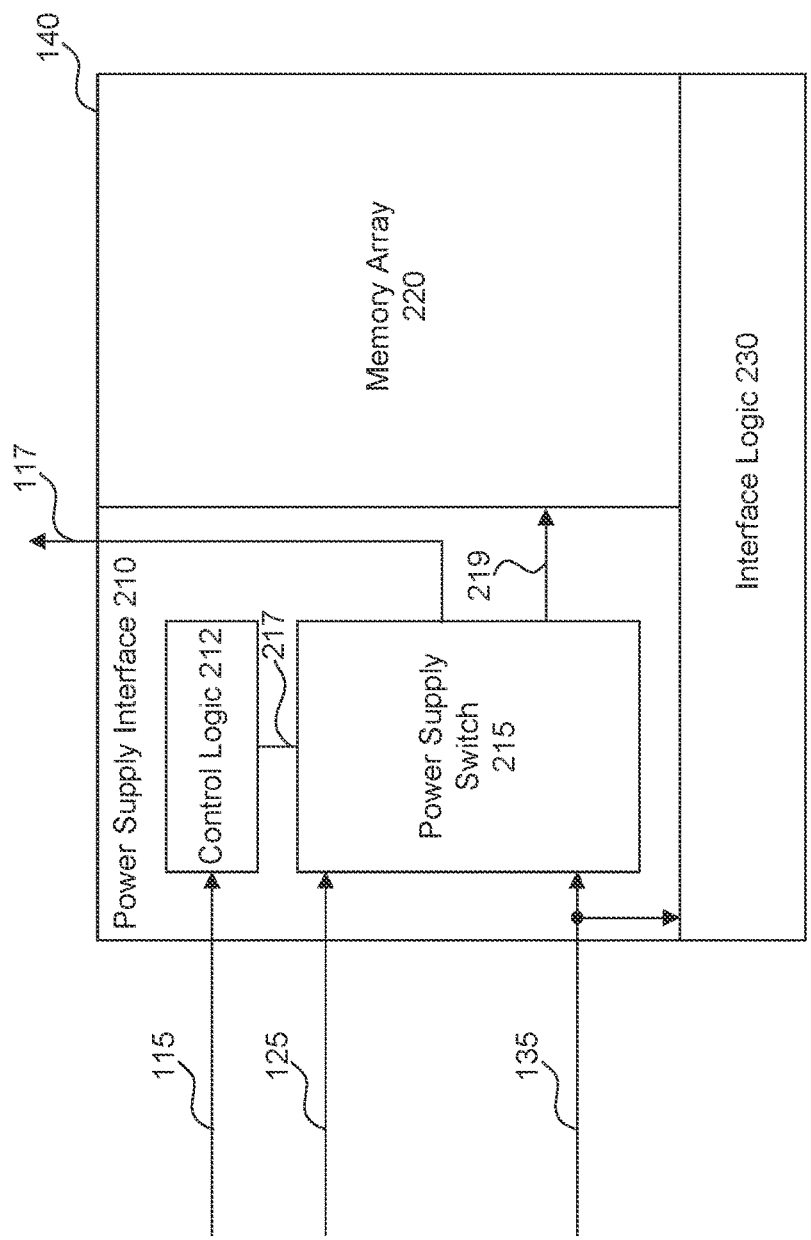
FIG. 2 is an illustration of a memory device in a system on chip, according to some embodiments.

FIG. 2 is an illustration of memory device 140, according to some embodiments. Memory device 140 includes a power supply interface 210, a memory array 220, and an interface logic circuit 230. Power supply interface 210 receives control signal 115, power supply voltage 125, and power supply voltage 135. Power supply voltage 135 is provided to interface logic circuit 230. Memory device 140 can include other components, which are within the spirit and scope of the present disclosure. For simplicity, these other components are not shown in FIG. 2.

In some embodiments, power supply interface 210 includes a control logic circuit 212 and a power supply switch 215. Control logic circuit 212 receives control signal 115 (from controller device 110 in FIG. 1) to transition the power supply voltage to memory array 220 from power supply voltage 125 to power supply voltage 135, according to some embodiments. For example, when control signal 115 transitions from a logic high to a logic low (e.g. transition from '1' to '0'), a voltage control signal 217 from control logic 212 controls power supply switch 215 to transition a voltage output signal 219 of power supply switch 215 from power supply voltage 125 to power supply voltage 135—and vice versa. Power supply switch 215 receives power supply voltages 125 and 135. Based on voltage control signal 217, power supply switch 215 provides voltage output signal 219—either power supply voltage 125 or power supply voltage 135—as a power supply input to memory array 220.

In some embodiments, under normal operation of SOC 100, power supply voltage 125 (e.g., 0.7V) is provided to memory array 220. And, under normal operation of SOC 100, power supply voltage 125 (e.g., 0.7V) is at a higher voltage level than power supply voltage 135 (e.g., 0.4V). In some operations, SOC 100 may raise the voltage level of power supply voltage 135 (e.g., from 0.4V to 1.0V) for improved SOC performance. In some embodiments, when raising power supply voltage 135, the power supply voltage to memory array 220 can also be raised for improved memory performance. For example, memory array 220 can raise its power supply voltage to the same voltage level as power supply voltage 135 (e.g., 1.0V).

A benefit, among others, in raising the power supply voltage provided to memory array 220 is that circuits in memory array 220 can operate faster, thus improving memory performance. For example, memory array 220 can include circuits such as oscillators, amplifiers, and voltage generators. With a higher power supply voltage (e.g., power supply voltage 135) provided to these circuits, memory array 220 can operate faster, thus improving the performance of memory read and write operations.

Figure 3:
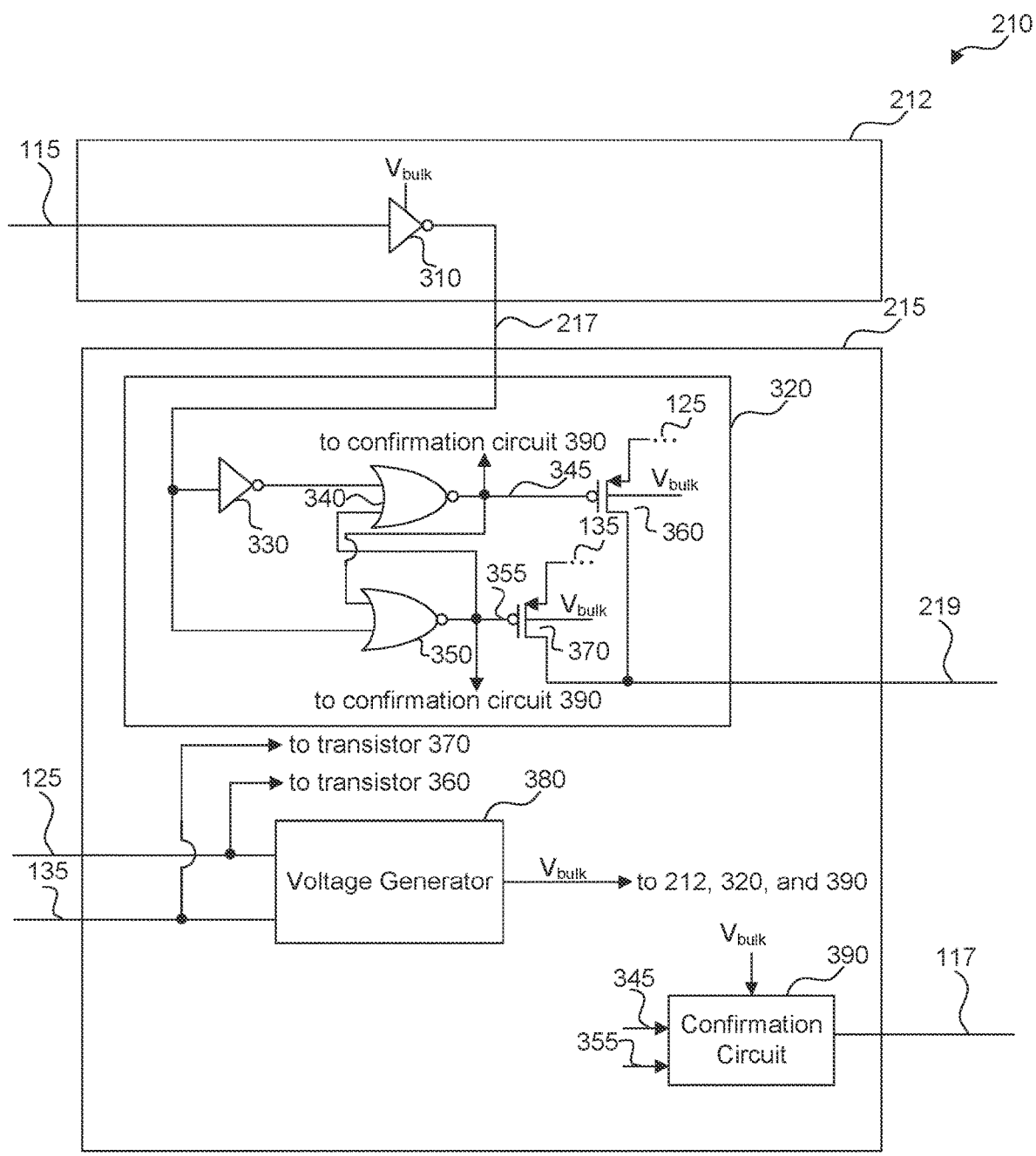
FIG. 3 is an illustration of control logic and a power supply switch for a power supply interface of a memory device in a system on chip, according to some embodiments.

FIG. 3 is an illustration of power supply interface 210—which includes control logic circuit 212 and power supply switch 215—according to some embodiments. Control logic circuit 212 includes a level-shifting inverter circuit 310. Level-shifting inverter circuit 310 receives a voltage $V_{bulk}$ as a power supply voltage. If level-shifting inverter circuit 310 receives a logic low signal (e.g., 0V) at its input as control signal 115, then inverter circuit 310 generates a logic high signal—i.e., voltage $V_{bulk}$—as an output at voltage control signal 217. Conversely, if level-shifting inverter circuit 310 receives a logic high signal (e.g., power supply voltage 135) at its input as control signal 115, then inverter circuit 310 generates ground (e.g., 0V) as an output at voltage control signal 217. The generation of voltage $V_{bulk}$ is described in further detail below with respect to FIG. 4.

In referring to FIG. 3, power supply switch 215 includes a switch circuit 320, a voltage generator 380, and a confirmation circuit 390. In some embodiments, switch circuit 320 includes an inverter circuit 330, NOR circuits 340 and 350, p-type metal-oxide-semiconductor field-effect-transistors ("PMOSFETs," "PMOS devices," or "p-type transistors") 360 and 370.

In some embodiments, based on a value of voltage control signal 217 (e.g., either logic high—e.g., voltage $V_{bulk}$—or ground), switch circuit 320 provides power supply voltage 125 or power supply voltage 135 as an output at voltage output signal 219. For example, if the value of voltage control signal 217 is a logic high (e.g., voltage $V_{bulk}$), then an output 345 of NOR circuit 340 would be at logic high (e.g., voltage $V_{bulk}$), thus turning off PMOS device 360. Conversely, an output 355 of NOR circuit 350 would be at logic low (e.g., ground or 0V), thus turning on PMOS device 370. As a result, PMOS device 370 passes power supply voltage 135 to voltage output signal 219.

If the value of voltage control signal 217 is a logic low (e.g., ground or 0V), then output 355 of NOR circuit 350 would be at logic high (e.g., voltage $V_{bulk}$), thus turning off PMOS device 370. Conversely, output 345 of NOR circuit 340 would be at logic low (e.g., ground or 0V), thus turning on PMOS device 360. As a result, PMOS device 360 passes power supply voltage 125 to voltage output signal 219.

As shown in FIG. 3, bulk terminals of PMOS devices 360 and 370 are electrically connected to voltage $V_{bulk}$. Also, though not shown in FIG. 3, the power supply and bulk terminals of PMOS devices in inverter circuit 330, and NOR circuits 340 and 350 are electrically connected to voltage $V_{bulk}$. In some embodiments, voltage $V_{bulk}$ is set to the higher of either power supply voltage 125 or power supply voltage 135. The generation of voltage $V_{bulk}$ is described below with respect to voltage generator 380. And, by connecting voltage $V_{bulk}$ to the bulk terminals of the PMOS devices in inverter circuit 330, NOR circuits 340 and 350, PMOS devices 360 and 370, currents generated by parasitic p-n junction diodes in the PMOS devices can be reduced or eliminated, thus preventing latch-up.

Figure 4:
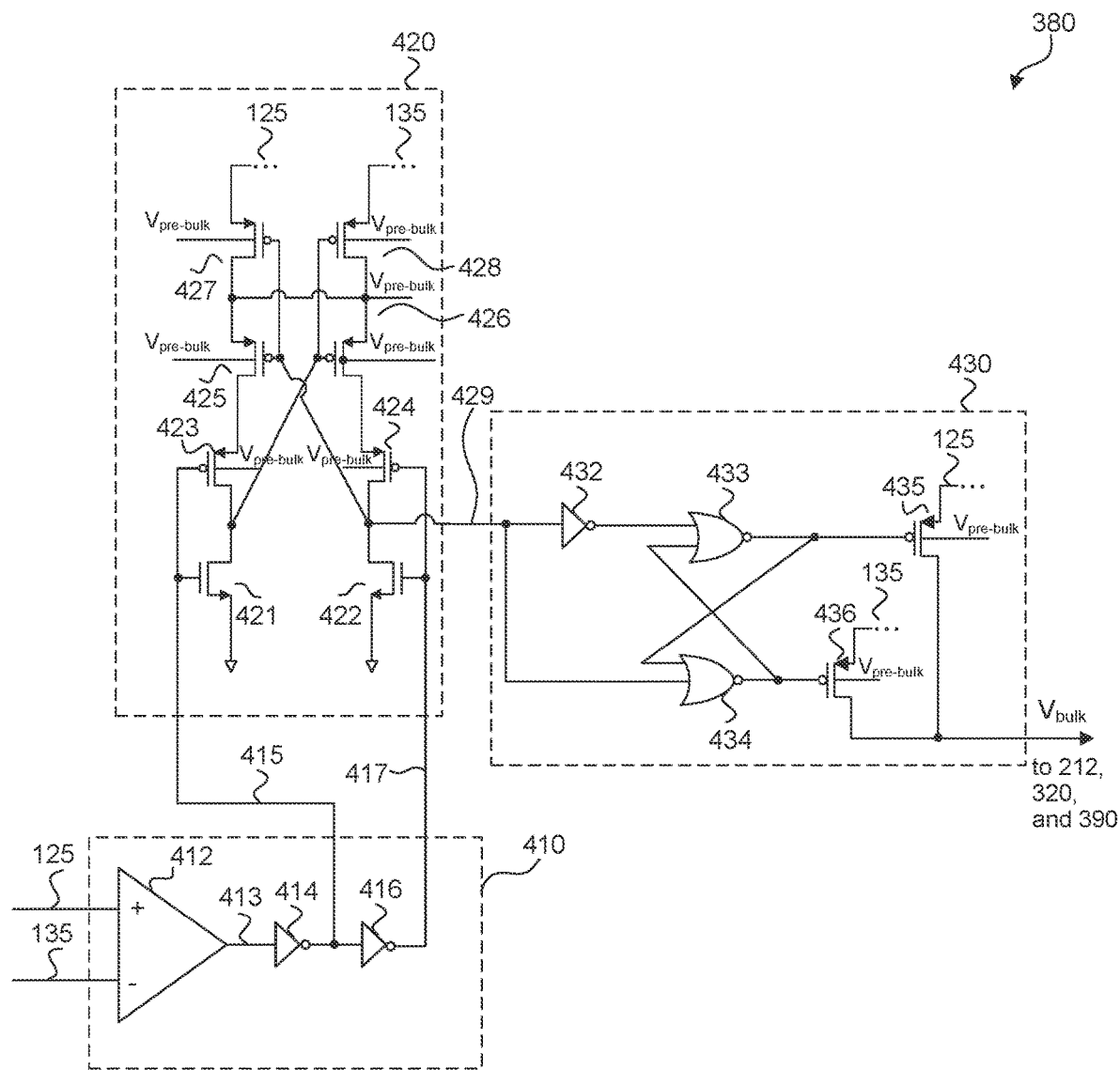
FIG. 4 is an illustration of a voltage generator for a power supply interface of a memory device in a system on chip, according to some embodiments.

Voltage generator 380 generates voltage $V_{bulk}$. FIG. 4 is an illustration of voltage generator 380, according to some embodiments. Voltage generator 380 includes a comparator circuit 410, an initialization circuit 420, and a bulk terminal switch 430. Comparator circuit 410 includes a comparator 412 and inverter circuits 414 and 416. Comparator 412 receives power supply voltage 125 (e.g., at a positive terminal) and power supply voltage 135 (e.g., at a negative terminal) and compares the two power supply voltages to one another. In some embodiments, comparator 412 determines the higher of the two power supply voltages. Comparator 412 can have a low-pass filter response and detect a 1 mV difference between power supply voltage 125 and power supply voltage 135 with less than ins response time, according to some embodiments. Though not shown in FIG. 4, the power supply and bulk terminals of PMOS devices in comparator 412 and inverter circuits 414 and 416 are electrically connected to power supply voltage 125, according to some embodiments. In some embodiments, the value of power supply voltage 125 can range between 0.6V and 0.8V (e.g., 0.7V).

Figure 5A:
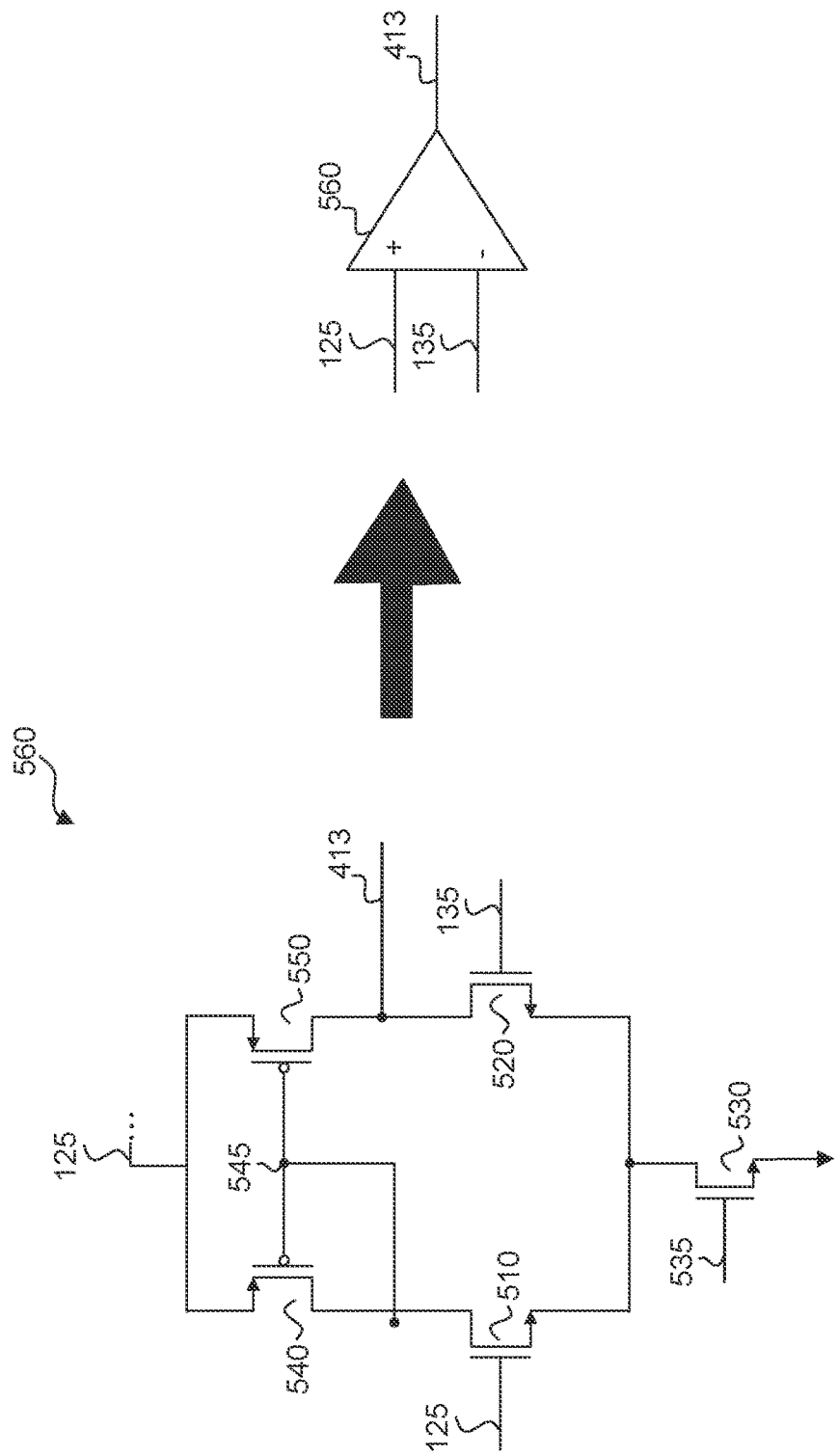
FIGS. 5A-C are illustrations of different comparator configurations, according to some embodiments.
Figure 5B:
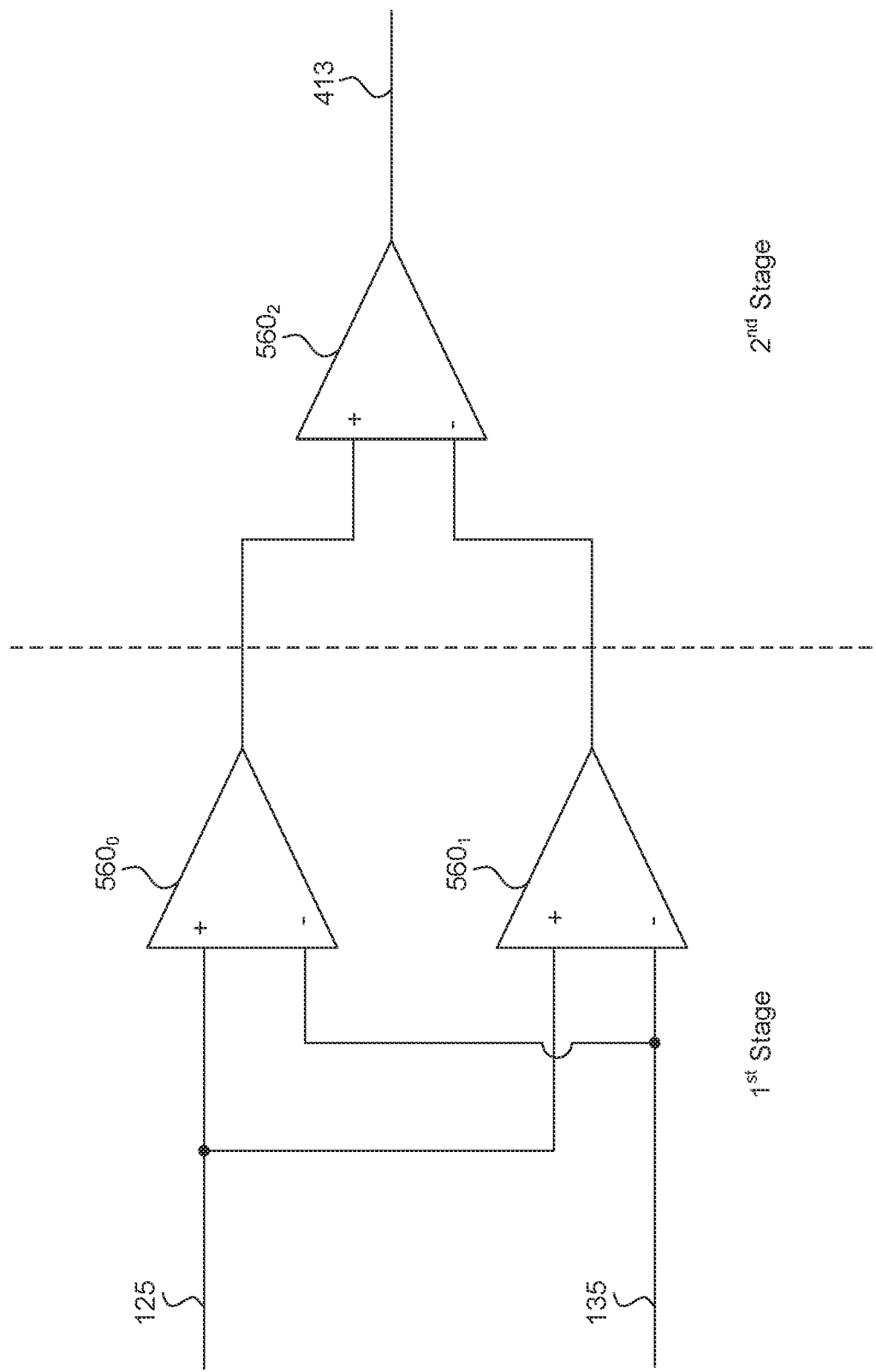
Figure 5C:
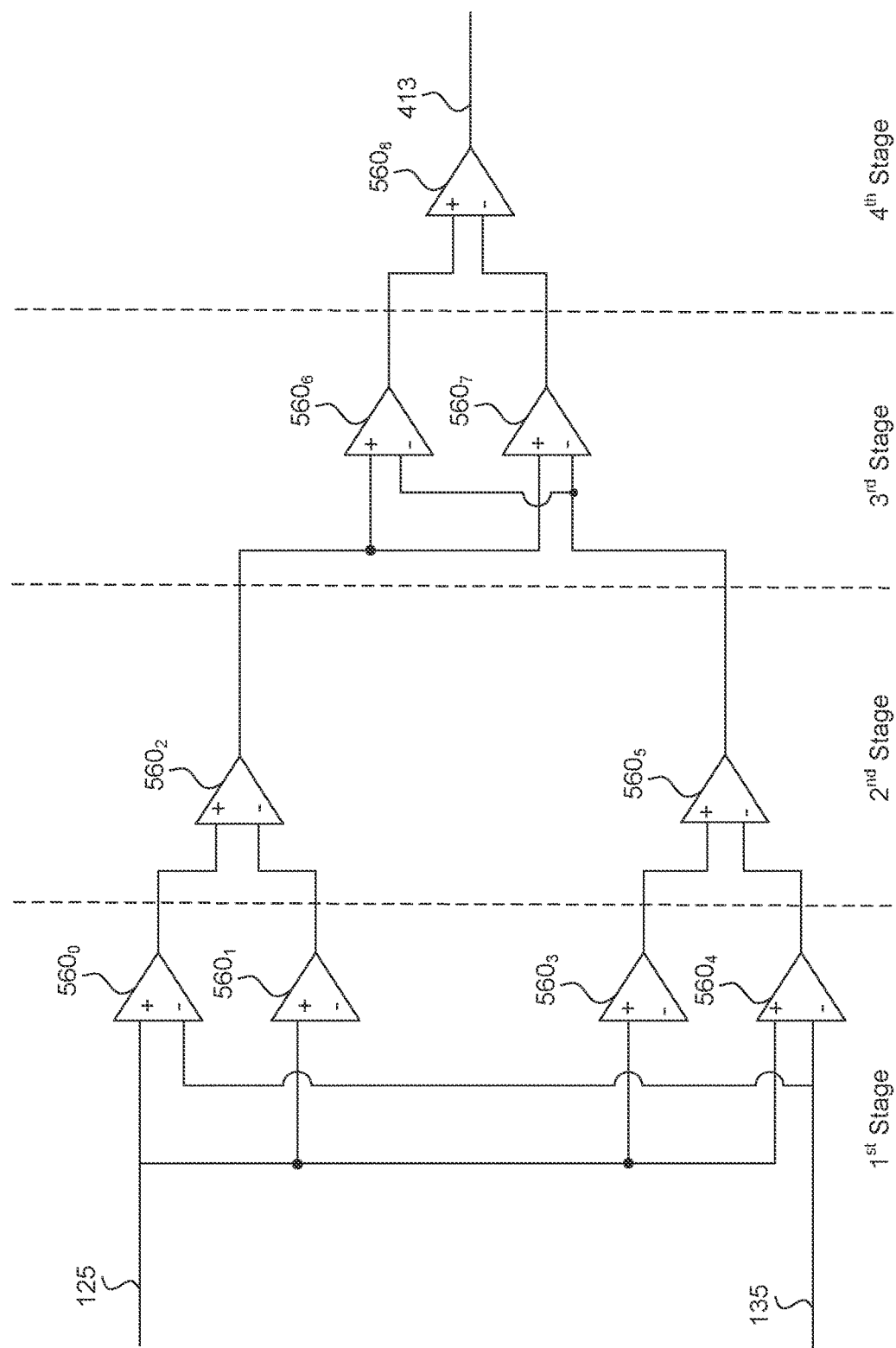

FIGS. 5A-C are illustrations of different configurations for comparator 412, according to some embodiments. FIG.

5A shows a single-stage comparator configuration 560 (also referred to herein as "comparator 560") for comparator 412. A symbol representation of comparator 560 is shown on the right of FIG. 5A.

Comparator 560 includes n-type metal-oxide-semiconductor field-effect-transistors ("NMOSFETs," "NMOS devices," or "n-type transistors") 510-530 and PMOS devices 540-550. Power supply voltage 125 is electrically connected to a gate terminal of NMOS device 510 (e.g., positive input terminal of comparator 560). Power supply voltage 135 is electrically connected to a gate terminal of NMOS device 520 (e.g., negative input terminal of comparator 560). Further, an enable signal 535 is electrically connected to a gate terminal of NMOS device 530, in which enable signal 535 enables the comparator by turning on NMOS device 530 (e.g., with a logic high voltage such as power supply voltage 125 or power supply voltage 135)—which serves as a current source for comparator 560.

Power supply voltages 125 and 135 are provided to the gate terminals of NMOS devices 510 and 520, respectively. Based on the voltage applied to the gate terminal of NMOS devices 510 and 520, either a comparator output 413 or a circuit node 545 is pulled towards ground (e.g., 0V). For example, if power supply voltage 125 is higher than power supply voltage 135, a "gate drive" at the gate terminal of NMOS device 510 is greater than a gate drive at the gate terminal of NMOS device 520, thus creating a lower resistive path to ground (e.g., 0V) for circuit node 545 (via NMOS devices 510 and 530) than comparator output 413. Circuit node 545 is pulled towards ground (e.g., 0V), thus turning on PMOS device 550 and transferring power supply voltage 125 (e.g., a logic high value) to comparator output 413. Conversely, if power supply voltage 135 is higher than power supply voltage 125, the gate drive at the gate terminal of NMOS device 520 is greater than the gate drive at the gate terminal of NMOS device 510, thus creating a lower resistive path to ground (e.g., 0V) for comparator output 413 (via. NMOS devices 520 and 530) than circuit node 545. Comparator output 413 is pulled near or to ground (e.g., 0V or a logic low value).

FIG. 5B shows a two-stage comparator configuration for comparator 412 in FIG. 4. In some embodiments, the two-stage comparator configuration includes comparators $560_0$-$560_2$. In the first stage, power supply voltage 125 is electrically connected to the positive input terminals of comparators $560_0$ and $560_1$. Power supply voltage 135 is electrically connected to the negative input terminals of comparators $560_0$ and $560_1$. In the second stage, an output of comparator $560_0$ is electrically connected to a positive input terminal of comparator $560_2$. An output of comparator $560_1$ is electrically connected to the negative input terminal of comparator $560_2$. The two-stage comparator configuration of FIG. 5B operates in a similar manner as the single-stage comparator configuration of FIG. 5A: (i) when power supply voltage 125 is higher than power supply voltage 135, power supply voltage 125 (e.g., a logic high value) is transferred to comparator output 413; and (ii) when power supply voltage 135 is higher than power supply voltage 125, comparator output 413 is pulled near or to ground (e.g., 0V or a logic low value).

FIG. 5C shows a four-stage comparator configuration for comparator 412 in FIG. 4. In some embodiments, the four-stage comparator configuration includes comparators $560_0$-$560_8$. In the first stage, power supply voltage 125 is electrically connected to positive input terminals of comparators $560_0$, $560_1$, $560_3$, and $560_4$. Power supply voltage 135 is electrically connected to negative input terminals of comparators $560_0$, $560_1$, $560_3$, and $560_4$. In the second stage, an output of comparator $560_0$ is electrically connected to a positive input terminal of comparator $560_2$, an output of comparator $560_1$ is electrically connected to a negative input terminal of comparator $560_2$, an output of comparator $560_3$ is electrically connected to a positive input terminal of comparator $560_5$, and an output of comparator $560_4$ is electrically connected to a negative input terminal of comparator $560_5$. In the third stage, an output of comparator $560_2$ is electrically connected to positive input terminals of comparators $560_6$ and $560_7$ and an output of comparator $560_5$ is electrically connected to negative input terminals of comparators $560_6$ and $560_7$. In the fourth stage, an output of comparator $560_6$ is electrically connected to a positive input terminal of comparator $560_8$ and an output of comparator $560_7$ is electrically connected to a negative input terminal of comparator $560_8$. The four-stage comparator configuration of FIG. 5C operates in a similar manner as the single-stage comparator configuration of FIG. 5A: (i) when power supply voltage 125 is higher than power supply voltage 135, power supply voltage 125 (e.g., a logic high value) is transferred to comparator output 413; and (ii) when power supply voltage 135 is higher than power supply voltage 125, comparator output 413 is pulled near or to ground (e.g., 0V or a logic low value).

FIG. 6 is an illustration of an example timing waveform 600 for power supply voltage 125 and power supply voltage 135, according to some embodiments. As discussed above, with respect to FIG. 1, power supply generator 120 provides power supply voltage 125 to memory device 140. In particular, with respect to FIG. 2, power supply voltage 125 (e.g., 0.7V) is provided to memory array 220 under normal operation of SOC 100. Further, with respect to FIG. 1, power supply generator 130 provides power supply voltage 135 (e.g., 0.4V) to memory device 140, processor device 150, and processor device 160.

In some embodiments, in referring to FIG. 1, controller device 110 is configured to raise power supply voltage 135 (e.g., from 0.4V to 1.0V)—via control signal 118—for improved SOC performance. FIG. 6 shows power supply voltage 135 transitioning from 0.4V to 1.0V at time $t_{transition0}$, which indicates a transition in control signal 118 (not shown)—e.g., control signal 118 can transition from a logic low to a logic high at time $t_{transition0}$. At time $t_{transition0}$, power supply voltage 125 remains at 0.7V. At time $t_{tratsition1}$, power supply voltage 135 can transition from 1.0V to 0.4V, which indicates a transition in control signal 118—e.g., control signal can transition from a logic high to a logic low at time $t_{transition1}$.

In referring to FIG. 4, comparator circuit 410 compares power supply voltage 125 to power supply voltage 135. When power supply voltage 125 is greater than power supply voltage 135 (e.g., from time=0 to time $t_{overlap0}$ and from time $t_{overlap1}$ onwards in FIG. 6), comparator output 413 is at logic high (e.g., power supply voltage 125). Conversely, if power supply voltage 125 is less than power supply voltage 135 (e.g., between time $t_{overlap0}$ and time $t_{overlap1}$), comparator output 413 is at logic low (e.g., ground or 0V). With a logic high (e.g., power supply voltage 125) at comparator output 413, an output 415 of inverter circuit 414 is at logic low (e.g., ground or 0V) and an output 417 of inverter circuit 416 is at logic high (e.g., power supply voltage 125). Conversely, with a logic low (e.g., ground or 0V) at comparator output 413, output 415 of inverter circuit 414 is at logic high (e.g., power supply voltage 125) and output 417 of inverter circuit 416 is at logic low (e.g., ground or 0V).

In referring to FIG. 4, initialization circuit 420 receives outputs 415 and 417 from comparator 410. Initialization circuit 420 includes NMOS devices 421 and 422 and PMOS devices 423-428. Based on outputs 415 and 417, initialization circuit 420 generates a voltage $V_{pre-bulk}$, which is based on the higher of power supply voltage 125 and power supply voltage 135. In some embodiments, voltage $V_{pre-bulk}$ is provided to bulk terminals of PMOS devices 423-428 in initialization circuit 420. Voltage $V_{pre-bulk}$ is also provided to bulk terminals of PMOS devices in bulk terminal switch 430—which is described in further detail below—according to some embodiments. By providing these PMOS devices with $V_{pre-bulk}$ (the higher voltage of either power supply voltage 125 or power supply voltage 135), currents generated by parasitic p-n junction diodes in the PMOS devices can be reduced or eliminated during the voltage transition between power supply voltage 125 and power supply voltage 135, thus preventing latch-up.

If output 415 is at logic high (e.g., power supply voltage 125) and output 417 is at logic low (e.g., ground or 0V), this condition indicates that power supply voltage 135 is greater than power supply voltage 125 (e.g., between time $t_{overlap0}$ and time $t_{overlap1}$ in FIG. 6). Under this condition, NMOS device 421 pulls the gate terminals of PMOS devices 426 and 428 to ground (e.g., 0V), thus turning on PMOS devices 426 and 428. In turn, a drain terminal of PMOS device 428—i.e., $V_{pre-bulk}$—is electrically connected to power supply voltage 135 (which is greater than power supply voltage 125). Also, with output 417 at logic low, PMOS device 424 passes logic high (e.g., power supply voltage 135) to an output 429.

Conversely, if output 415 is at logic low (e.g., ground or 0V) and output 417 is at logic high (e.g., power supply voltage 125), this condition indicates that power supply voltage 125 is greater than power supply voltage 135 (e.g., from time=0 to time $t_{overlap0}$ and from time $t_{overlap1}$ onwards in FIG. 6). Under this condition, NMOS device 422 pulls the gate terminals of PMOS devices 425 and 427 to ground (e.g., 0V), thus turning on PMOS devices 425 and 427. In turn, a drain terminal of PMOS device 427—i.e., $V_{pre-bulk}$—is electrically connected to power supply voltage 125 (which is greater than power supply voltage 135). Also, with output 417 at logic high, NMOS device 422 passes logic low (e.g., ground or 0V) to output 429.

In referring to FIG. 4, bulk terminal switch 430 receives output 429 from initialization circuit 420. Bulk terminal switch 430 includes an inverter circuit 432, NOR circuits 433 and 434, and PMOS devices 435 and 436. As shown in FIG. 4, bulk terminals of PMOS devices 435 and 436 are electrically connected to voltage $V_{pre-bulk}$. Also, though not shown in FIG. 4, power supply and bulk terminals of PMOS devices in inverter circuit 432 and NOR circuits 433-434 are electrically connected to voltage $V_{pre-bulk}$. By providing these PMOS devices with $V_{pre-bulk}$ (the higher voltage of either power supply voltage 125 or power supply voltage 135), currents generated by parasitic p-n junction diodes in the PMOS devices can be reduced or eliminated during the voltage transition between power supply voltage 125 and power supply voltage 135, thus preventing latch-up.

If output 429 is at logic high (e.g., power supply voltage 135), NOR circuit 434 outputs a logic low (e.g., ground or 0V) to a gate terminal of PMOS device 436, thus turning on PMOS device 436 and providing power supply voltage 135 to voltage $V_{bulk}$ at the output of bulk terminal switch 430. Conversely, if output 429 is logic low (e.g., ground or 0V). NOR circuit 433 outputs a logic low (e.g., ground or 0V) to a gate terminal of PMOS device 435, thus turning on PMOS device 435 and providing power supply voltage 125 to voltage $V_{bulk}$ at the output of bulk terminal switch 430.

Figure 7:
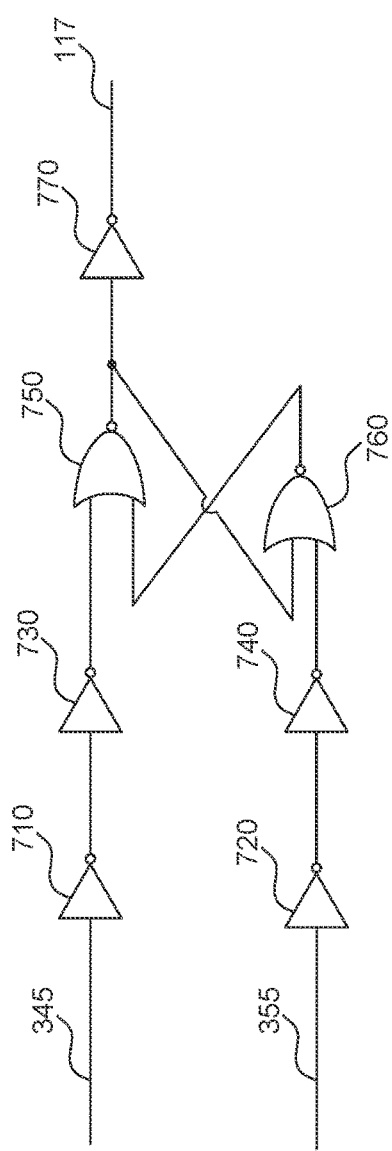
FIG. 7 is an illustration of a confirmation circuit for a power supply interface of a memory device in a system on chip, according to some embodiments.

In referring to FIG. 3, voltage $V_{bulk}$ is provided to control logic circuit 212, switch circuit 320, and confirmation circuit 390. FIG. 7 is an illustration of confirmation circuit 390, according to some embodiments. Confirmation circuit 390 includes inverter circuits 710-740 and 770 and NOR circuits 750-760. Though not shown in FIG. 6, the power supply and bulk terminals of PMOS devices in inverter circuits 710-740 and NOR circuits 750-760 are electrically connected to voltage $V_{bulk}$ (generated by voltage generator 380). Also, though not shown in FIG. 7, the power supply and bulk terminals in inverter circuit 770 are electrically connected to power supply voltage 135.

Based on signal 345 (output of NOR circuit 340 in switch circuit 320 of FIG. 3) and signal 355 (output of NOR circuit 350 in switch circuit 320 of FIG. 3), confirmation circuit 390 generates confirmation signal 117 to indicate that switch circuit 320 has transitioned voltage output signal 219— which is a power supply input to memory array 220—from power supply voltage 125 to power supply voltage 135. For example, if signal 345 is at logic low and signal 355 is at logic high, confirmation signal 117 is at logic low. In some embodiments, a logic low value for confirmation signal 117 indicates that voltage output signal 219 has not transitioned from power supply voltage 125 to power supply voltage 135. Conversely, if signal 345 is at logic high and signal 355 is at logic low, confirmation signal 117 is at logic high. In some embodiments, a logic high value for confirmation signal 117 indicates that voltage output signal 219 has transitioned from power supply voltage 125 to power supply 135—e.g., when power supply voltage 135 is greater than power supply voltage 125.

In some embodiments, in referring to FIG. 1, confirmation signal 117 can indicate to controller device 110 that the power supply to the memory array e.g., memory array 220 of FIG. 2) of memory device 140 has transitioned from power supply voltage 125 (e.g., 0.7V) to power supply voltage 135 (e.g., 1.0V). In turn, controller device 110 can indicate to other components of SOC 100—e.g., processor devices 150 and 160—that the memory array of memory device 140 has transitioned to the higher power supply voltage 135 and can be accessed for memory operations such as, for example, read or write memory operations. With the higher power supply voltage 135 (e.g., 1.0V) provided to the memory array, circuits in the memory array (e.g., oscillators, amplifiers, and voltage generators) can operate faster, thus improving memory performance.

Figure 8:
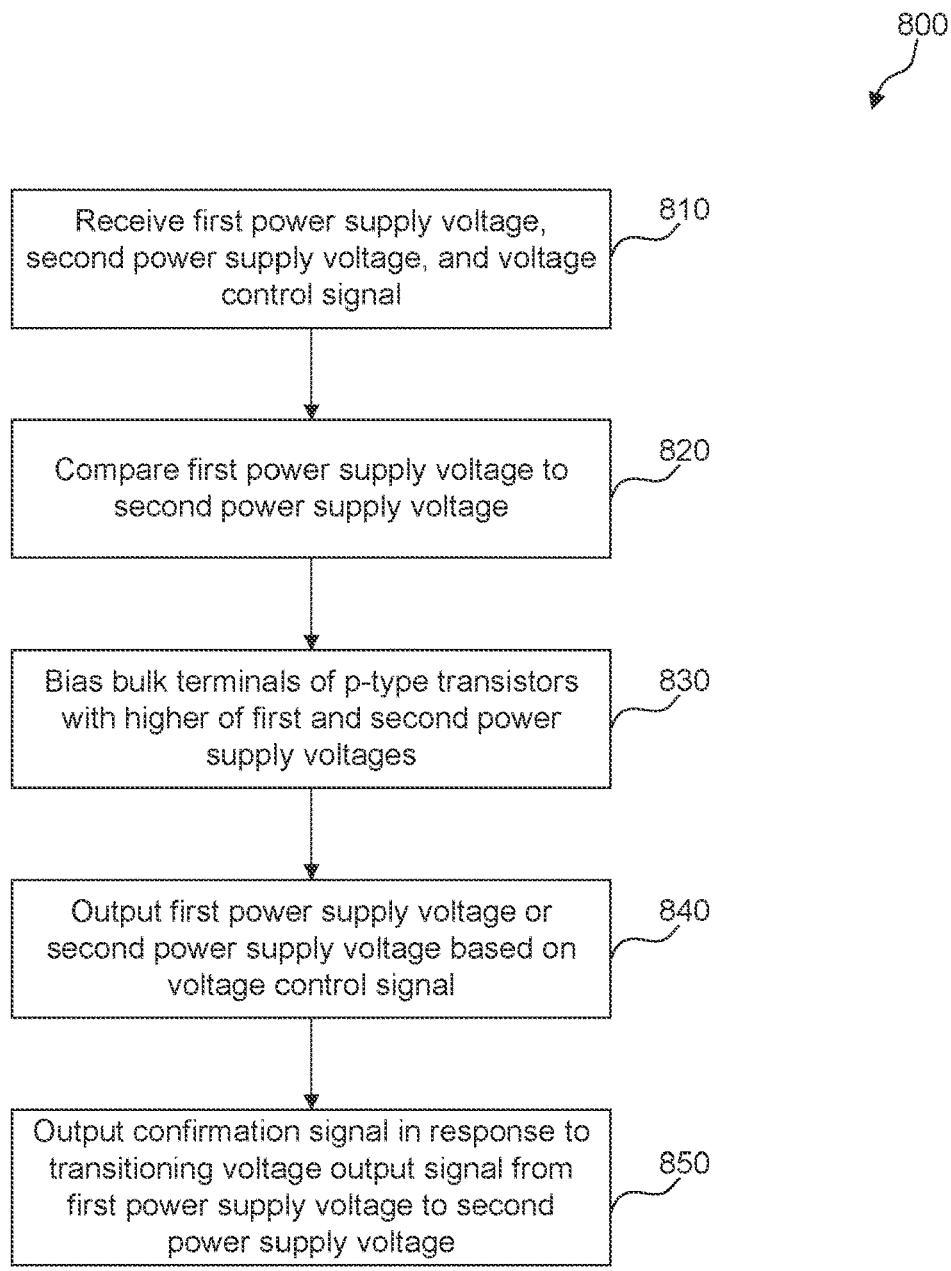
FIG. 8 is an illustration of a method for transitioning a memory device from a first power supply voltage to a second power supply voltage, according to some embodiments.

FIG. 8 is an illustration of a method 800 for transitioning a memory device from a first power supply voltage to a second power supply voltage, according to some embodiments. The operations shown in method 800 can be performed by, for example, power supply switch 215 of FIGS. 2-7. Other operations in method 800 can be performed. Further, the operations of method 800 can be performed in a different order and/or vary.

At operation 810, a first power supply voltage, a second power supply voltage, and a voltage control signal is received by a power supply switch. In referring to FIG. 2, power supply switch 215 receives a power supply voltage 125 (e.g., a first power supply voltage), a power supply voltage 135 (e.g., a second power supply voltage), and a voltage control signal 217.

At operation 820, the first power supply voltage is compared to the second power supply voltage by the power supply switch to determine the higher of the first and second power supply voltages. In referring to FIG. 3, power supply switch 215 includes a voltage generator 380. In referring to FIG. 4, voltage generator 380 includes a comparator circuit 410. As described above, with respect to FIG. 4, comparator circuit 410 includes a comparator 412 configured to compare power supply voltage 125 (e.g., the first power supply voltage) to power supply voltage 134 (e.g., the second power supply voltage) to determine the higher of the first and second power supply voltages.

At operation 830, bulk terminals of one or more p-type transistors in the power supply switch are biased with the higher of the first and second power supply voltages. In referring to FIG. 4, initialization circuit 420 generates a voltage $V_{pre-bulk}$, which is based on the higher of power supply voltage 125 and power supply voltage 135 (e.g., higher of the first and second power supply voltages). In some embodiments, voltage $V_{pre-bulk}$ is provided to bulk terminals of PMOS devices 423-428 in initialization circuit 420. Voltage $V_{pre-bulk}$ is also provided to bulk terminals of PMOS devices in bulk terminal switch 430, according to some embodiments. Voltage $V_{pre-bulk}$ can transition from power supply voltage 125 to power supply voltage 135 in response to the power supply voltage 135 exceeding power supply voltage 125. By providing these PMOS devices with voltage $V_{pre-bulk}$ (the higher of power supply voltage 125 and power supply voltage 135), currents generated by parasitic p-n junction diodes in the PMOS devices can be reduced or eliminated during the voltage transition between power supply voltage 125 and power supply voltage 135, thus preventing latch-up.

At operation 840, based on the voltage control signal, the first power supply voltage or the second power supply voltage is outputted by the power supply switch. In referring to FIG. 3, power supply switch 215 includes switch circuit 320. In some embodiments, based on a value of voltage control signal 217 (e.g., either logic high—e.g., voltage $V_{bulk}$—or ground), switch circuit 320 provides power supply voltage 125 or power supply voltage 135 as an output at voltage output signal 219 (e.g., output of the power supply switch). For example, if the value of voltage control signal 217 is a logic high, switch circuit 320 passes power supply voltage 135 to voltage output signal 219. Conversely, if the value of voltage control signal 217 is a logic low (e.g., ground or 0V), switch circuit 320 passes power supply voltage 125 to voltage output signal 219.

At operation 850, a confirmation signal is outputted by the power supply switch that indicates a transition of the voltage output signal from the first power supply voltage to the second power supply voltage. In referring to FIG. 3, power supply switch 215 includes confirmation circuit 390. In some embodiments, confirmation circuit 390 generates confirmation signal 117 to indicate that switch circuit 320 has transitioned voltage output signal 219—which is a power supply input to memory array 220—from power supply voltage 125 to power supply voltage 135. In some embodiments, a logic low value for confirmation signal 117 indicates that voltage output signal 219 has not transitioned from power supply voltage 125 to power supply 135. Conversely, in some embodiments, a logic high value for confirmation signal 117 indicates that voltage output signal 219 has transitioned from power supply voltage 125 to power supply voltage 135—e.g., when power supply voltage 135 is greater than power supply voltage 125.

The present disclosure describes power supply switch, memory device, system, power supply interface, and method embodiments for transitioning a power supply voltage provided to a memory array of the memory device between a first power supply voltage and a second power supply voltage. A benefit, among others, in transitioning the power supply voltage from the first power supply voltage to the second power supply voltage—e.g., from a lower power supply voltage to a higher power supply voltage—is that circuits in the memory array can operate faster, thus improving memory performance. For example, the memory array can include circuits such as oscillators, amplifiers, and voltage generators. With a higher power supply voltage provided to these circuits, the memory array can operate faster, thus improving memory read and write performance.

In some embodiments, the power supply switch includes a voltage generator, a switch circuit, and a confirmation circuit. The voltage generator is configured to (i) compare a first power supply voltage to a second power supply voltage and (ii) output the higher of the first and second power supply voltages as a bulk voltage ($V_{bulk}$). The switch circuit includes one or more p-type transistors and is configured to (i) bias bulk terminals of the one or more p-type transistors with the $V_{bulk}$ and (ii) output either the first power supply voltage or the second power supply voltage as a voltage output signal. The confirmation circuit is configured to output a confirmation signal that indicates whether the voltage output signal transitioned from the first power supply voltage to the second power supply voltage.

In some embodiments, the memory device includes an interface logic circuit, a memory array, and a power supply interface. The memory array is coupled to the interface logic circuit. The power supply interface includes a control logic circuit configured to output a voltage control signal and a power supply switch configured to receive a first power supply voltage and a second power supply voltage. The power supply switch includes a voltage generator and a switch circuit. The voltage generator is configured to compare the first power supply voltage to the second power supply voltage and to output the higher of the first and second power supply voltages as a bulk voltage ($V_{bulk}$). The switch circuit includes one or more p-type transistors and is configured to bias bulk terminals of the one or more p-type transistors with the $V_{bulk}$ and, based on the voltage control signal, to output either first power supply voltage or the second power supply voltage as a voltage output signal to the memory array.

In some embodiments, the method includes receiving, with a power supply switch, a first power supply voltage, a second power supply voltage, and a voltage control signal. The method also includes (i) comparing, with the power supply switch, the first power supply voltage to the second power supply voltage to determine the higher of the first and second power supply voltages and (ii) biasing, in the power supply switch, bulk terminals of one or more p-type transistors with the higher of the first and second power supply voltages. The method further includes outputting, with the power supply switch, the first power supply voltage or the second power supply voltage based on the voltage control signal.

In some embodiments, the system includes a controller device, a first power supply generator, a second power supply generator, one or more processor devices, and a memory device. The controller device is configured to output a control signal. The first and second power supply generators are configured to output first and second power supply voltages, respectively. The one or more processor devices are configured to receive the second power supply voltages. The memory device is configured to receive the first and second power supply voltages and the control signal and includes (i) an interface logic circuit configured to receive the second power supply voltage, (ii) a memory array coupled to the interface logic circuit, and (iii) a power supply switch configured to receive the first and second power supply voltages. The power supply switch includes a voltage generator and a switch circuit. The voltage generator is configured to compare the first power supply voltage to the second power supply voltage and to output the higher of the first and second power supply voltages as a bulk voltage ($V_{bulk}$). The switch circuit includes one or more p-type transistors and is configured to bias bulk terminals of the one or more p-type transistors with the $V_{bulk}$ and, based on the control signal, to output either first power supply voltage or the second power supply voltage as a voltage output signal to the memory array.

In some embodiments, the power supply interface includes (i) a control logic circuit configured to output a voltage control signal and (ii) a power supply switch configured to receive a first and second power supply voltages. The power supply switch includes a voltage generator and a switch circuit. The voltage generator is configured to compare the first power supply voltage to the second power supply voltage and to output the higher of the first and second power supply voltages as a bulk voltage ($V_{bulk}$). The switch circuit includes one or more p-type transistors and is configured to bias bulk terminals of the one or more p-type transistors with the $V_{bulk}$ and, based on the voltage control signal, to output either first power supply voltage or the second power supply voltage as a voltage output signal to the memory array.

In some embodiments, another method includes receiving, with a memory device, a first power supply voltage, a second power supply and a control signal. The method also includes (i) transitioning, with a controller device, a second power supply voltage from a first voltage lower than the first power supply voltage to a second voltage higher than the first power supply voltage, (ii) comparing, with the memory device, the first power supply voltage to the second power supply voltage to determine the higher of the first and second power supply voltages, and (iii) biasing, in the memory device, bulk terminals of one or more p-type transistors with the higher of the first and second power supply voltages. The method further includes outputting, in the memory device, the first power supply voltage or the second power supply, voltage based on the control signal.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A power supply switch, comprising:
    a voltage generator configured to compare a first power supply voltage to a second power supply voltage and to output a bulk voltage; and
    a switch circuit comprising one or more transistors and configured to:
        bias bulk terminals of the one or more transistors with the bulk voltage; and
        output either the first power supply voltage or the second power supply voltage as a voltage output signal.

2. The power supply switch of claim 1, wherein the voltage generator comprises:
    a comparator circuit configured to compare the first power supply voltage to the second power supply voltage and to generate a comparator output based on the comparison;
    an initialization circuit configured to provide a pre-bulk voltage to one or more transistors in the voltage generator based on the comparator output; and
    a bulk terminal switch configured to output the bulk voltage based on the comparison.

3. The power supply switch of claim 2, wherein the comparator circuit is configured to transition the comparator output in response to the second power supply voltage exceeding the first power supply voltage.

4. The power supply switch of claim 3, wherein the initialization circuit is configured to transition the pre-bulk voltage from the first power supply voltage to the second power supply voltage in response to the transition of the comparator output.

5. The power supply switch of claim 2, wherein the bulk terminal switch is configured to transition the bulk voltage from the first power supply voltage to the second power supply voltage in response to the transition of the comparator output.

6. The power supply switch of claim 1, wherein the switch circuit is configured to:
    receive a voltage control signal; and
    output either one of the first power supply voltage or the second power supply voltage as the voltage output signal based on the voltage control signal.

7. The power supply switch of claim 1, wherein the switch circuit further comprises:
    an inverter circuit configured to receive an initialization signal; and
    a NOR circuit configured to receive a signal from the inverter circuit and output the bulk voltage to bias the bulk terminals.

8. A memory device, comprising:
    an interface logic circuit;
    a memory array coupled to the interface logic circuit; and
    a power supply interface comprising:
        a power supply switch configured to receive a first power supply voltage and a second power supply voltage, the power supply switch comprising:
            a voltage generator configured to compare the first power supply voltage to the second power supply voltage and to output the higher of the first and second power supply voltages as a bulk voltage; and
            a switch circuit configured to bias a transistor bulk terminal with the bulk voltage and to output either the first power supply voltage or the second power supply voltage as a voltage output signal to the memory array.

9. The memory device of claim 8, wherein the power supply switch further comprises a confirmation circuit configured to output a confirmation signal that indicates whether the voltage output signal transitioned from the first power supply voltage to the second power supply voltage.

10. The memory device of claim 9, wherein the confirmation circuit comprises one or more inputs electrically connected to a respective one or more internal circuit nodes of the switch circuit, and wherein the confirmation circuit is configured to transition the confirmation signal based on the one or more internal circuit nodes.

11. The memory device of claim 8, wherein the first power supply voltage is provided to the memory array and the second power supply voltage is provided to the interface logic circuit.

12. The memory device of claim 8, wherein the switch circuit further comprises:
an inverter circuit configured to receive an initialization signal; and
a NOR circuit configured to receive a signal from the inverter circuit and output the bulk voltage to bias the bulk terminals.

13. The memory device of claim 8, wherein the voltage generator comprises:
a comparator circuit configured to compare the first power supply voltage to the second power supply voltage and to generate a comparator output based on the comparison;
an initialization circuit configured to provide a pre-bulk voltage to the transistor bulk terminal in the voltage generator based on the comparator output; and
a bulk terminal switch to output the bulk voltage based on the comparison.

14. The memory device of claim 13, wherein the comparator circuit is configured to transition the comparator output in response to the second power supply voltage exceeding the first power supply voltage.

15. The memory device of claim 14, wherein the initialization circuit is configured to transition the pre-bulk voltage from the first power supply voltage to the second power supply voltage in response to the transition of the comparator output.

16. The memory device of claim 13, wherein the bulk terminal switch is configured to transition the bulk voltage from the first power supply voltage to the second power supply voltage in response to the transition of the comparator output.

17. The memory device of claim 8, wherein the switch circuit is configured to output either one of the first power supply voltage or the second power supply voltage as the voltage output signal based on the voltage control signal.

18. A method, comprising:
receiving a first power supply voltage, a second power supply voltage, and a voltage control signal;
biasing a transistor bulk terminal with the higher of the first power supply voltage and second power supply voltage; and
outputting, based on the voltage control signal, the first power supply voltage or the second power supply voltage.

19. The method of claim 18, further comprising outputting a confirmation signal that indicates whether a transition from the first power supply voltage to the second power supply voltage occurred.

20. The method of claim 18, wherein the biasing comprises transitioning a voltage applied to the transistor bulk terminal in response to the second power supply voltage exceeding the first supply voltage.

* * * * *